(12) United States Patent
Kobayashi

(10) Patent No.: US 6,995,893 B2
(45) Date of Patent: Feb. 7, 2006

(54) ELECTRO-OPTICAL DEVICE, METHOD FOR MANUFACTURING ELECTRO-OPTICAL DEVICE, APPARATUS FOR MANUFACTURING ELECTRO-OPTICAL DEVICE, AND ELECTRONIC APPARATUS

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 196 days.

(21) Appl. No.: 10/420,828

(22) Filed: Apr. 23, 2003

(65) Prior Publication Data
US 2004/0109218 A1 Jun. 10, 2004

(30) Foreign Application Priority Data
May 10, 2002 (JP) .............................. 2002-136240

(51) Int. Cl.
*G02F 1/15* (2006.01)
*G09G 3/12* (2006.01)

(52) U.S. Cl. ...................... 359/272; 359/274; 359/290; 345/36; 345/37; 345/38; 345/39; 345/40; 345/41; 345/42; 345/45; 345/76; 257/433; 349/58; 349/60; 349/122; 349/155

(58) Field of Classification Search ........ 359/265–275, 359/290–298, 223, 224; 345/36–42, 45, 345/76; 347/263; 257/433, 678–733; 349/58, 349/60, 122, 155
See application file for complete search history.

(56) References Cited

U.S. PATENT DOCUMENTS

| | | | | |
|---|---|---|---|---|
| 4,761,061 A | * | 8/1988 | Nishiyama et al. | 359/265 |
| 6,268,071 B1 | | 7/2001 | Yasukawa et al. | 428/690 |
| 6,636,192 B1 | * | 10/2003 | Saitoh | 345/87 |
| 6,791,660 B1 | * | 9/2004 | Hayashi et al. | 349/190 |

FOREIGN PATENT DOCUMENTS

| | | |
|---|---|---|
| JP | A-57-51781 | 3/1982 |
| JP | A-59-194393 | 11/1984 |
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |
| JP | A-11-40358 | 2/1999 |

* cited by examiner

*Primary Examiner*—Evelyn A. Lester
(74) *Attorney, Agent, or Firm*—Oliff & Berridge, PLC

(57) ABSTRACT

The invention provides an electro-optical device, a method of manufacturing an electro-optical device, an apparatus for manufacturing an electro-optical device, and an electronic apparatus, in which, in the electro-optical device, a gap formed between two substrates functioning as constituent elements thereof or the thickness of an adhesive layer, which adheres the two substrates to each other, can be precisely controlled. The electro-optical device has at least a substrate and a sealing substrate which is adhered to the substrate and which is composed of a transparent plate member, in which the substrate and the sealing substrate are adhered to each other with an adhesive layer provided therebetween so as to form a gap therebetween; measurement surfaces, used to measure the thickness of the adhesive layer, are provided in the gap; and on the measurement surfaces, an adhesive is not provided.

11 Claims, 6 Drawing Sheets

[Fig. 1]
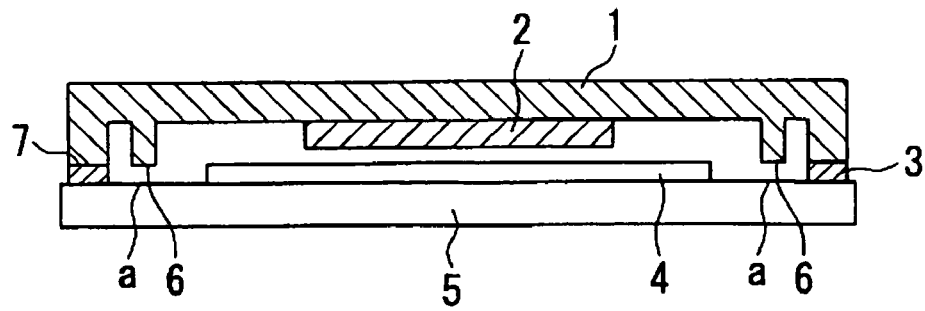
[Fig. 2]
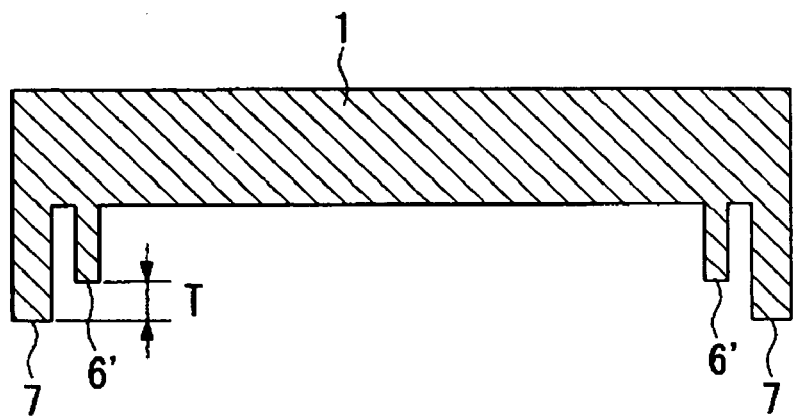
[Fig. 3]
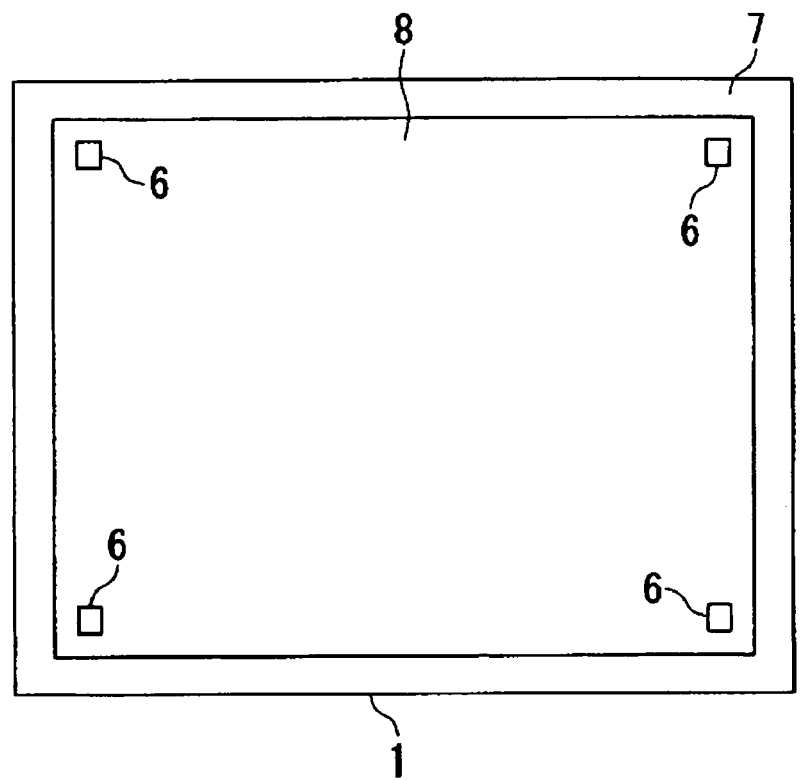

[Fig. 4]
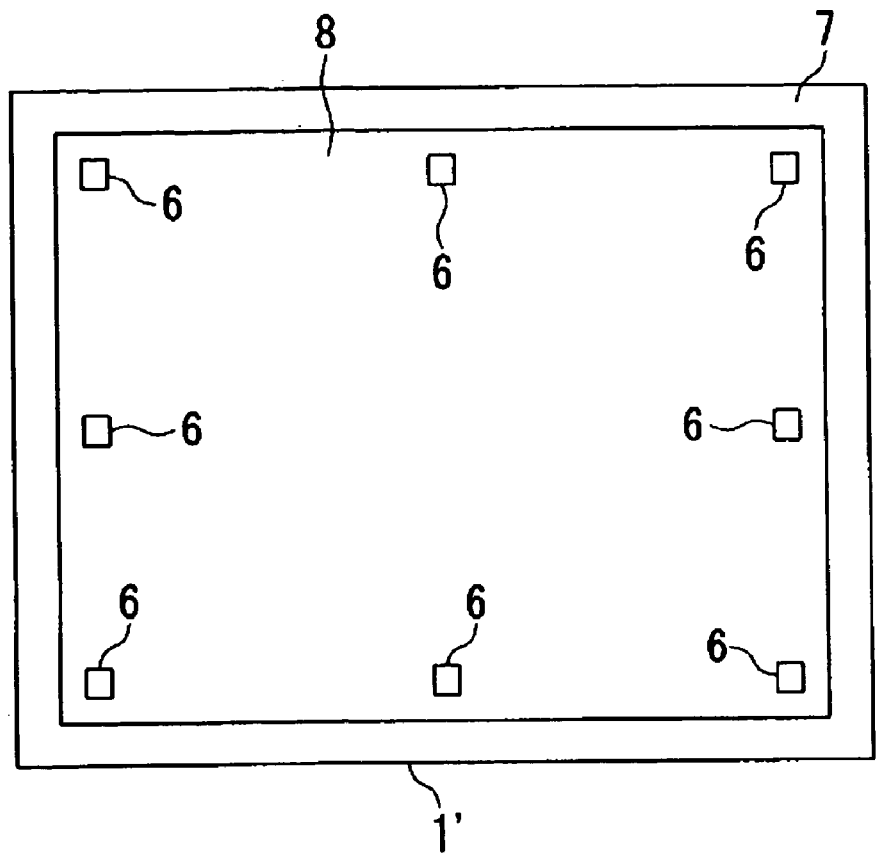
[Fig. 5]
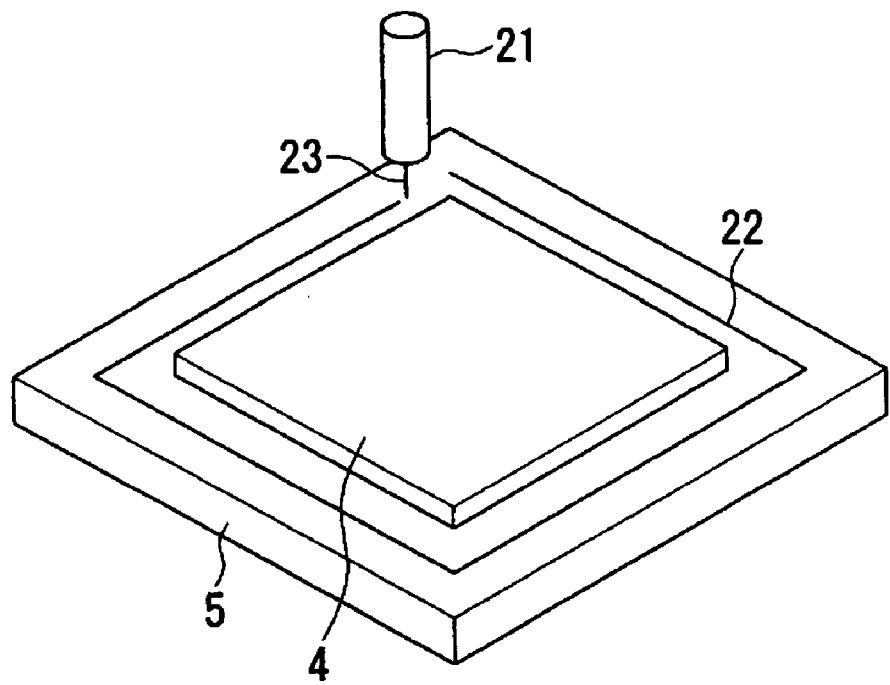

[Fig. 6]
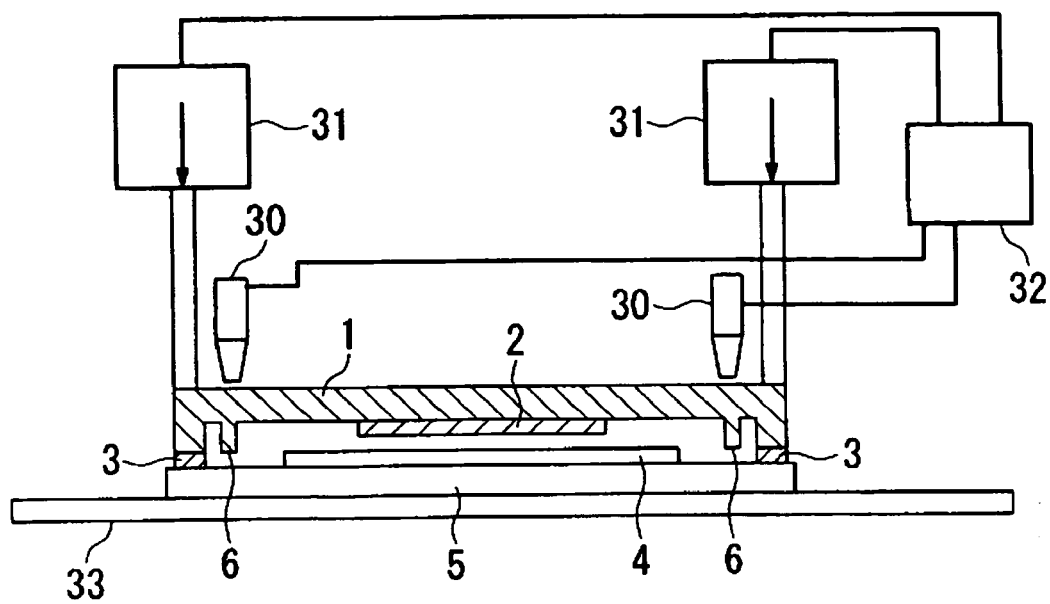
[Fig. 7]
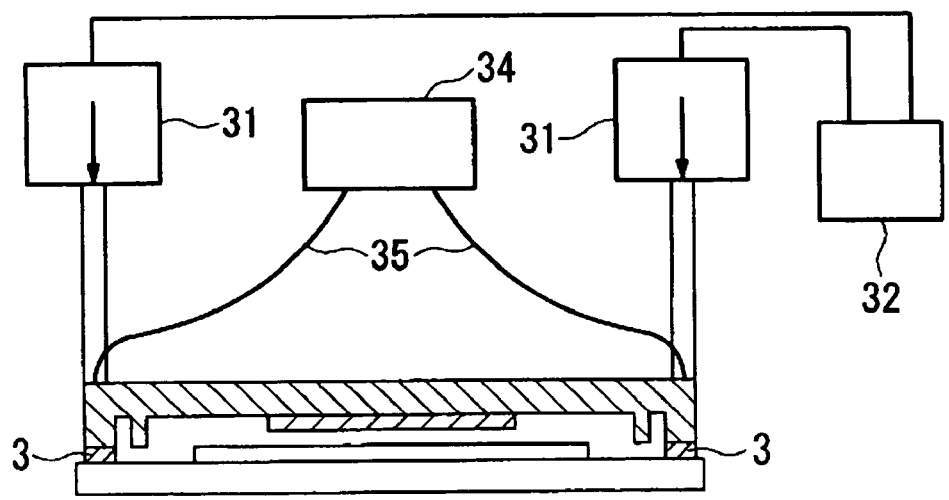

[Fig. 8]
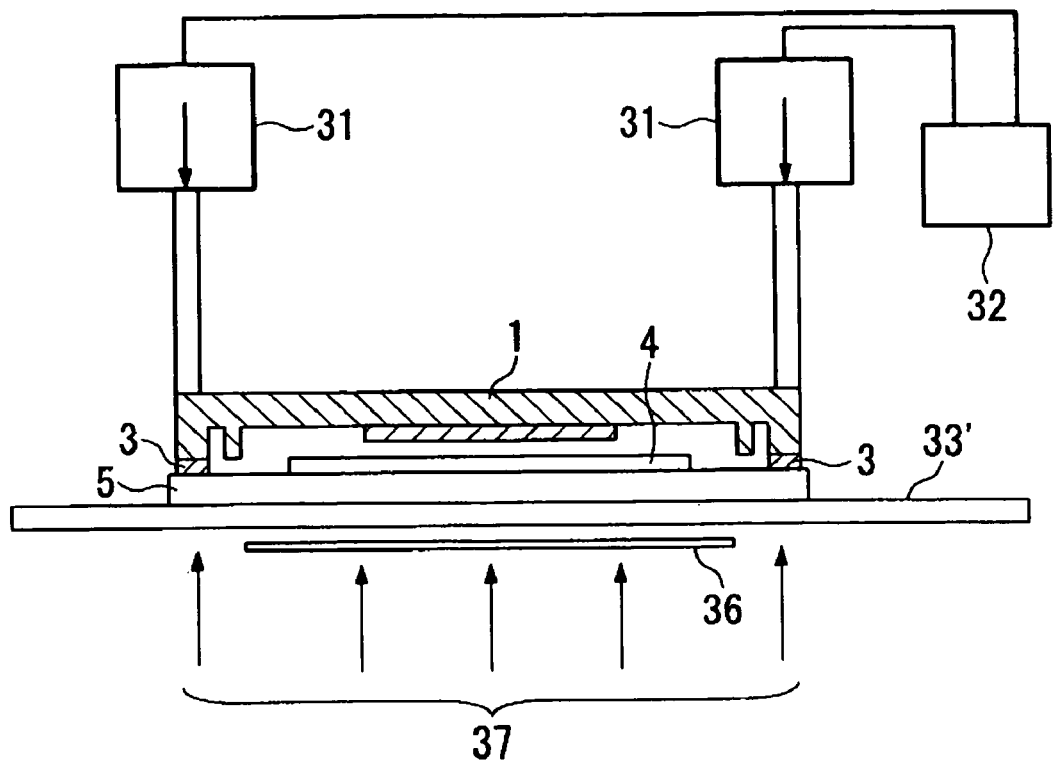
[Fig. 9]
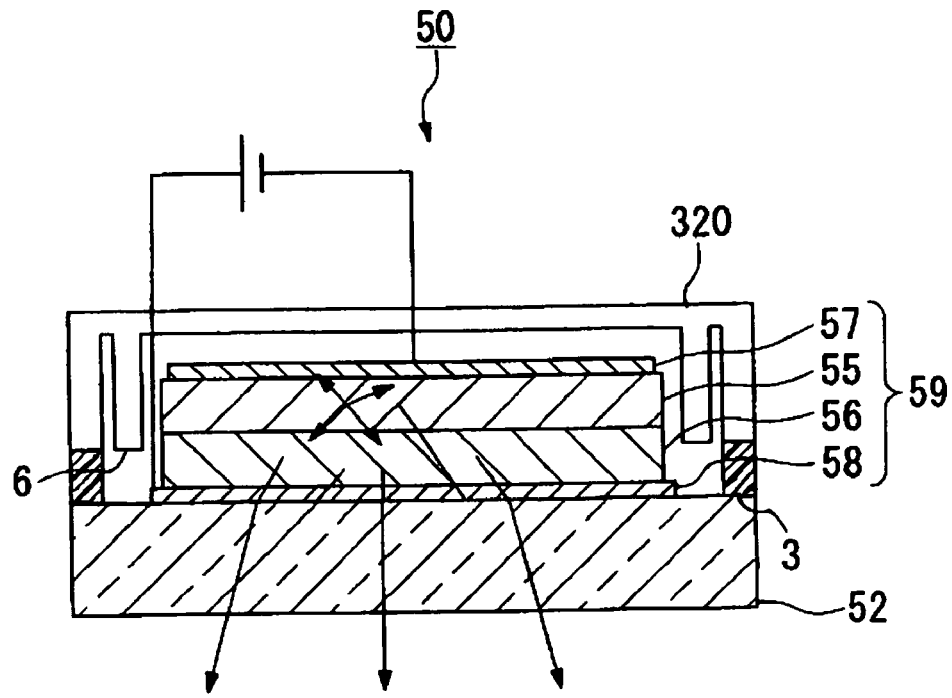

[Fig. 10]
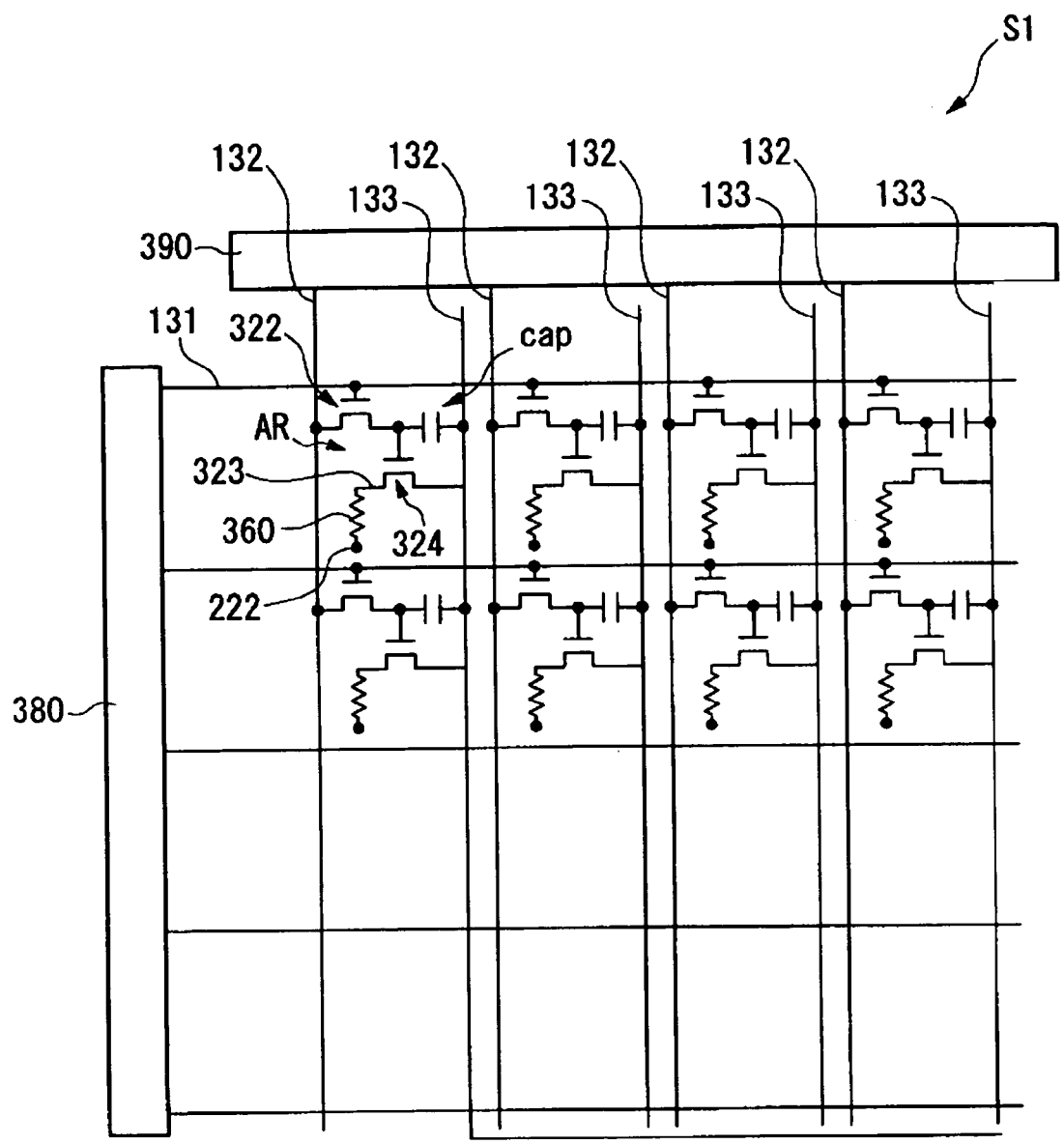

[Fig. 11]
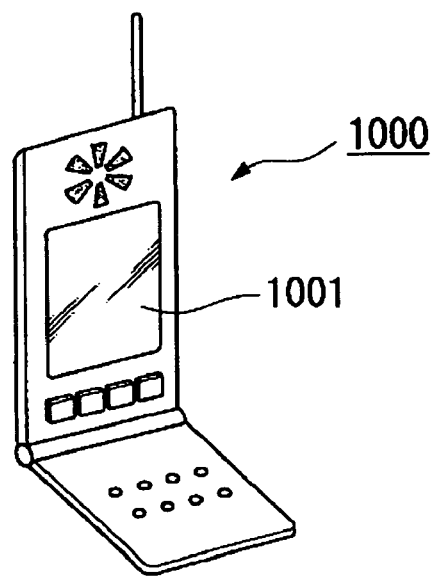
[Fig. 12]
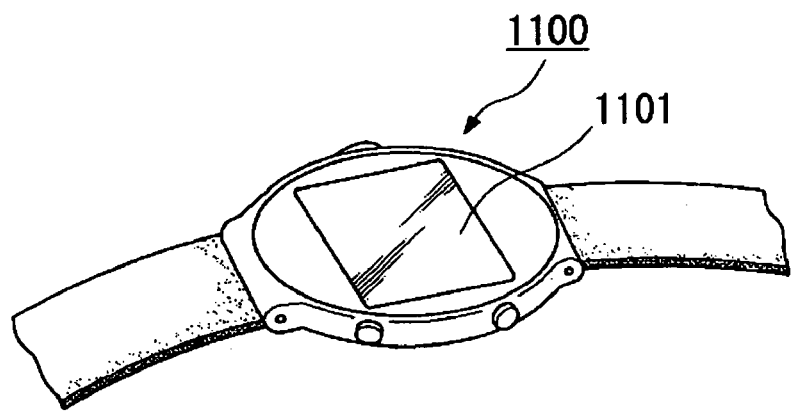
[Fig. 13]
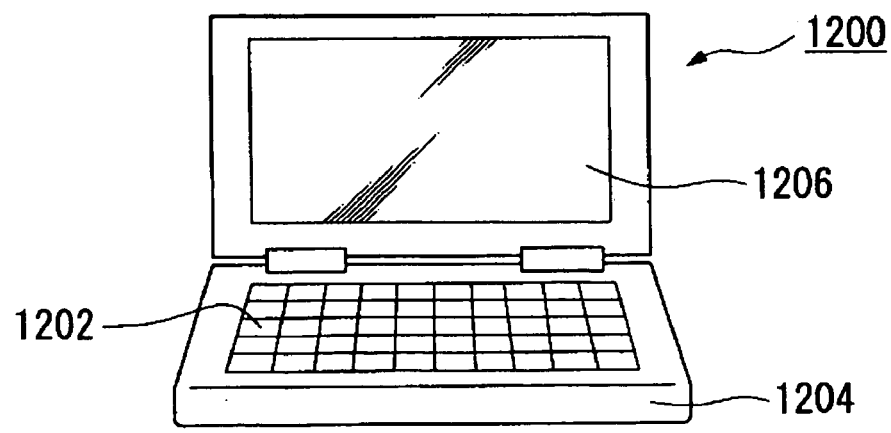

ELECTRO-OPTICAL DEVICE, METHOD FOR MANUFACTURING ELECTRO-OPTICAL DEVICE, APPARATUS FOR MANUFACTURING ELECTRO-OPTICAL DEVICE, AND ELECTRONIC APPARATUS

TECHNICAL FIELD

The present invention relates to electro-optical devices preferably used in particular as display for a mobile apparatus such as a mobile phone, a personal computer, a television, or the like, to methods for manufacturing electro-optical devices, to apparatuses for manufacturing electro-optical devices, and to electronic apparatuses.

BACKGROUND ART

Heretofore, in a manufacturing process for an organic EL device, in order to seal an organic EL substrate, a sealing substrate is adhered to the organic EL substrate with an adhesive. In this sealing process, a gap agent is mixed with the adhesive for controlling the gap between the sealing substrate and the organic EL substrate so that, even when the sealing substrate is contact bonded thereto, the thickness of an adhesive layer formed of the adhesive is not decreased to less than the diameter of the gap agent to make the thickness of the adhesive layer have a desired predetermined value. Subsequently, when deformed in a predetermined amount by contact bonding of the sealing substrate, the adhesive layer is cured by irradiation with ultraviolet rays or by heating. The conventional method for controlling the gap between the two substrates, as described above, has also been used in a manufacturing process for liquid crystal panels.

SUMMARY OF THE INVENTION

However, in the conventional method described above for controlling the gap between two substrates, since the gap agent must be mixed with the adhesive, for example, there have been problems in that 1) manufacturing cost is increased because of the use of the gap agent, 2) a nozzle for ejecting the adhesive is clogged with the gap agent, and 3) the gap between the two substrates cannot be accurately controlled.

An object of the present invention is to provide an electro-optical device in which the gap between two substrates used as constituent elements thereof or the thickness of an adhesive layer adhering the two substrates to each other can be precisely controlled, a method for manufacturing an electro-optical device, an apparatus for manufacturing an electro-optical device, and an electronic apparatus.

An electro-optical device of the present invention comprises a first substrate and a second substrate which is formed of a transparent plate member and is adhered to the first substrate, wherein the first substrate and the second substrate are adhered to each other with an adhesive layer provided therebetween. In addition, the first substrate and the second substrate are adhered to each other to form a gap therebetween, and in the gap, a measurement surface for measuring the thickness of the adhesive layer is provided. According to the device described above, in manufacturing the electro-optical device described above, since the thickness of the adhesive layer adhering the first substrate to the second substrate can be measured by using the measurement surface, an electro-optical device in which the thickness (the distance between the first substrate and the second substrate) of the adhesive layer has a desired value can be realized. Hence, according to the device described above, the product life can be increased. In addition, according to the device described above, since it is not necessary to mix the gap agent with an adhesive which forms the adhesive layer, a manufacturing cost relating to the gap agent can be reduced, and the nozzle for ejecting the adhesive can be prevented from being clogged with the gap agent.

In addition, it is preferable that the measurement surface not be applied with the adhesive. According to the device described above, by using the measurement surface, the thickness of the adhesive layer can be precisely measured.

In addition, the measurement surface is preferably provided at least as a part of the surface of the second substrate which faces the first substrate. According to the device described above, by using the measurement surface, since the distance between the first substrate and the second substrate can be measured, and thereby the thickness of the adhesive layer adhering the first substrate to the second substrate can be measured, an electro-optical device in which the adhesive layer has a desired thickness can be realized while the manufacturing cost thereof is reduced.

In addition, the surface of the first substrate, facing the measurement surface, preferably has a part having a reflectance of 90% or less. According to the device described above, since the thickness of the adhesive layer can be measured by using the interference between light reflected from the measurement surface and light reflected from the surface of the first substrate which faces the measurement surface, the thickness of the adhesive layer can be very precisely measured, and as a result, an electro-optical device can be realized in which the thickness (distance between the first substrate and the second substrate) of the adhesive layer is formed to have a precisely desired value. Consequently, according to the device described above, the product life can be further increased.

In addition, the measurement surface is preferably provided at a height approximately equivalent to that of an adhesion surface formed between the adhesive layer and the second substrate. According to the device described above, since the distance (actual measurement value) measured by using the measurement surface and the thickness of the adhesive layer becomes approximately equivalent to each other, the thickness of the adhesive layer can be more precisely measured.

In addition, the difference in height between the adhesive surface and the measurement surface is preferably 100 $\mu$m or less. According to the device described above, since the difference of the distance (actual measurement value) measured by using the measurement surface from the thickness of the adhesive layer can be made 100 $\mu$m or less, the thickness of the adhesive layer can be precisely measured.

In addition, the electro-optical device of the present invention is preferable in that the measurement surface is preferably processed by smoothing treatment. According to the device described above, since the thickness of the adhesive layer can be measured by using the interference between light reflected from the measurement surface and light reflected from the surface of the first substrate which faces the measurement surface, the thickness of the adhesive layer can be very precisely measured.

In addition, in the electro-optical device of the present invention, the measurement surface is preferably disposed at a part of a convex portion provided on the surface of the second substrate which faces the first substrate. According to the device described above, in manufacturing the electro-optical device, since the adhesive forming the adhesive layer, which adheres the first substrate to the second substrate, can be prevented from intruding onto the measurement surface, the thickness of the adhesive layer can be very precisely measured by using the measurement surface.

In addition, in the electro-optical device of the present invention, at least four measurement surfaces are preferably provided. According to the device described above, when the adhesive layer is provided in the vicinity of the periphery of the first substrate or the second substrate, the thickness of the adhesive layer substantially over the entire area thereof can be precisely measured, and as a result, the product life can be increased.

In addition, in the electro-optical device of the present invention, it is preferable that the first substrate and the second substrate each have a square shape and that the measurement surfaces be provided at the individual four corners of the square shape. According to the device described above, when the adhesive layer is provided in the vicinity of the periphery of the first substrate or the second substrate, the thickness of the adhesive layer substantially over the entire area thereof can be precisely measured.

In addition, in the electro-optical device of the present invention, between the first substrate and the second substrate, electrodes and a light-emitting layer are preferably provided. According to the device described above, in an organic EL device (electroluminescent device) as the electro-optical device, the light-emitting layer (organic EL element layer) can be precisely sealed with the second substrate (sealing substrate), the adhesive layer, and the first substrate, and as a result, while the manufacturing cost of the organic EL device is decreased, the product life can be increased.

In addition, in the gap described above, at least drying means or deoxidizing means is preferably provided. According to the device described above, for example, the gap can be dried for a long period of time, and as a result, an organic EL device which can maintain stable luminescent properties for a long period of time can be realized.

In addition, in the electro-optical device of the present invention, the electro-optical device described above preferably comprises a plurality of scanning lines and a plurality of data lines, which are formed in a matrix; switching means connected to the scanning lines and data lines; and pixel electrodes connected to the switching means. According to the device described above, when the first substrate and the second substrate are used as constituent elements of a liquid crystal device or an organic EL device, which is the electro-optical device, and on the first substrate or the second substrate, the plurality of scanning lines and the plurality of data lines, which are arranged in a matrix, the switching mean connected to the scanning lines and the data lines, and the pixel electrodes connected to the switching means are formed, while the manufacturing cost of the liquid crystal device or the organic EL device is decreased, the product life can be increased.

In addition, an electronic apparatus of the present invention comprises the electro-optical device described above. According to the present invention, while the manufacturing cost of the electronic apparatus is decreased, the product life can be increased.

In addition, an apparatus for manufacturing an electro-optical device, according to the present invention, is used when the electro-optical device described above is manufactured and comprises measuring means for measuring the thickness of the adhesive layer, contact bonding means for pressing at least one of the first substrate and the second substrate, and a controller for controlling operation of the contact bonding means in accordance with results measured by the measuring means. According to the apparatus for manufacturing an electro-optical device, described above, since an electro-optical device can be manufactured in which the adhesive layer has a desired predetermined thickness, while the manufacturing cost is decreased, an electro-optical device having a long life can be manufactured.

In addition, an apparatus for manufacturing an electro-optical device, according to the present invention, comprises: measuring means for measuring the thickness of the adhesive layer by using the interference between light reflected from a measurement surface, the measurement surface being at least a part of the surface of the second substrate which faces the first substrate, and light reflected from the surface of the first substrate which faces the measurement surface; contact bonding means for pressing at least one of the first substrate and the second substrate; and a controller for controlling operation of the contact bonding means in accordance with results measured by the measuring means. According to the apparatus for manufacturing an electro-optical device, described above, since an electro-optical device can be manufactured in which the adhesive layer has a more precise and desired predetermined thickness, while the manufacturing cost is decreased, an electro-optical device having superior display uniformity and a long life can be manufactured.

In addition, an apparatus for manufacturing an electro-optical device, according to the present invention, comprises: measuring means for measuring the thickness of the adhesive layer by using the difference between the state in which a microscopic optical system is focused on a predetermined surface of the first substrate and the state in which the microscopic optical system is focused on a predetermined surface of the second substrate or the measurement surface; contact bonding means for pressing at least one of the first substrate and the second substrate; and a controller for controlling operation of the contact bonding means in accordance with results measured by the measuring means.

According to the apparatus for manufacturing an electro-optical device, described above, since manufacturing can be performed while the thickness of the adhesive layer is precisely measured by using the microscopic optical system, an electro-optical device can be manufactured in which the adhesive layer has a precise and desired predetermined thickness. Hence, while the manufacturing cost is decreased, an electro-optical device having superior display uniformity and a long life can be manufactured.

In addition, in the apparatus of manufacturing an electro-optical device, according to the present invention, a desired pattern, which is used when the focusing is performed, is preferably formed on at least one of the predetermined surface of the first substrate, the predetermined surface of the second substrate, and the measurement surface. According to the apparatus for manufacturing an electro-optical device, described above, since the microscopic optical system can be more easily focused on the surface on which the pattern is formed, while the thickness of the adhesive layer can be measured more rapidly and precisely, the manufacturing can be performed.

In addition, in the apparatus for manufacturing an electro-optical device, according to the present invention, the measuring means preferably measures the thickness of the adhesive layer at a position close to that which is pressed by the contact bonding means. According to the apparatus for manufacturing an electro-optical device, described above, since the thickness of the adhesive layer can be more easily adjusted, an electro-optical device in which the adhesive layer has a more precise and desired predetermined value can be manufactured.

In addition, in the apparatus for manufacturing an electro-optical device, according to the present invention, it is preferable that the contact bonding means press a plurality of positions, the measuring means measure the thickness of the adhesive layer at a position close to each of said plurality of positions which are pressed by the contact bonding means, and the controller control the operation of the contact bonding means so that the individual measured values at said plurality of positions satisfy a desired value. According to the apparatus for manufacturing an electro-optical device, described above, the thickness of the adhesive layer can be automatically and precisely adjusted, and hence while the manufacturing cost of the electro-optical device is decreased, the life of a product having uniform display performance can be increased.

In addition, a method for manufacturing an electro-optical device, according to the present invention, is a method for manufacturing an electro-optical device comprising at least a first substrate and a second substrate which is adhered to the first substrate and which is composed of a transparent plate member. The method described above comprises: a step of applying an adhesive onto at least one of the first substrate and the second substrate; a disposing step of disposing the second substrate with respect to the first substrate so that a portion onto which the adhesive is applied forms an adhesive layer between the first substrate and the second substrate; a pressing step of pressing at least one of the first substrate and the second substrate so as to press the second substrate to the first substrate; and a step of sequentially measuring the thickness of the adhesive layer in the pressing step. According to the method for manufacturing an electro-optical device, described above, by sequentially measuring the thickness of the adhesive layer and, in accordance with the measured value, by controlling a force pressing the second substrate to the first substrate, an electro-optical device in which the adhesive layer has a desired thickness can be manufactured. For example, in the case of an organic EL device, the product life is increased, and in addition, in the case of a liquid crystal device, an electro-optical device having no display irregularity can be manufactured.

In addition, according to the manufacturing method described above, since it is not necessary to mix the gap agent with the adhesive which forms the adhesive layer, the manufacturing cost can be decreased, and the nozzle for ejecting the adhesive can be prevented from being clogged with the gap agent.

In addition, in the method for manufacturing an electro-optical device, according to the present invention, the thickness of the adhesive layer is preferably measured by using the interference between light reflected from a measurement surface, which is at least a part of the surface of the second substrate facing the first substrate, and light reflected from the surface of the first substrate facing the measurement surface. According to the method for manufacturing an electro-optical device, described above, since an electro-optical device in which the adhesive layer has a more precise and desired predetermined thickness can be manufactured, while the manufacturing cost is decreased, an electro-optical device having uniform display performance and a long life can be manufactured.

In addition, in the method for manufacturing an electro-optical device, according the present invention, the thickness of the adhesive layer is preferably measured by using the difference between the state in which a microscopic optical system is focused on a predetermined surface of the first substrate and the state in which the microscopic optical system is focused on a predetermined surface of the second substrate.

According to the method for manufacturing an electro-optical device, described above, since manufacturing of an electro-optical device can be performed while the thickness of the adhesive layer is precisely measured using the microscopic optical system, an electro-optical device in which the adhesive layer has a precise and desired predetermined value can be manufactured, and while the manufacturing cost is decreased, an electro-optical device having uniform display performance and a long life can be manufactured.

In addition, in the method for manufacturing an electro-optical device, according the present invention, in the pressing step, the pressing is preferably performed until the adhesive layer has a desired thickness. According to the method for manufacturing an electro-optical device, described above, an electro-optical device in which the adhesive layer has a precise and desired predetermined value can be manufactured.

In addition, the method for manufacturing an electro-optical device, according to the present invention, preferably comprises a step of curing the adhesive layer when the desired thickness thereof is obtained. According to the method for manufacturing an electro-optical device, described above, an electro-optical device in which the adhesive layer has a precise and desired predetermined value can be manufactured.

In addition, in the method for manufacturing an electro-optical device, according to the present invention, in the step of applying the adhesive, described above, the adhesive is preferably applied onto the periphery of at least one of the first substrate and the second substrate and a portion in the vicinity of said periphery except for the measurement surface. According to the method for manufacturing an electro-optical device, described above, a region surrounded by the first substrate, the second substrate, and the adhesive layer can be sealed, and in addition, the sealed state thus formed can be maintained for a long period of time.

In addition, according to the method for manufacturing an electro-optical device, according to the present invention, in the step of sequentially measuring the thickness of the adhesive layer, the thickness of the adhesive layer is preferably measured at a position close to that pressed in the pressing step. According to the method for manufacturing an electro-optical device, described above, an electro-optical device in which the adhesive layer has a precise and desired predetermined value can be manufactured.

In addition, according to the method for manufacturing an electro-optical device, according to the present invention, in the step of sequentially measuring the thickness of the adhesive layer, the thickness which is sequentially measured is preferably displayed. According to the method for manufacturing an electro-optical device, described above, the thickness of the adhesive layer can be confirmed during the manufacturing.

In addition, in the method for manufacturing an electro-optical device, according to the present invention, it is preferable that a plurality of the measurement surfaces be provided on the second substrate, and that in the pressing step, positions of at least one of the first substrate and the second substrate, which are close to the respective measurement surfaces, be pressed so that the thicknesses of the adhesive layer at the respective measurement surfaces are approximately equivalent to each other. According to the method for manufacturing an electro-optical device, described above, when the adhesive layer is disposed in the vicinity of the periphery of the first substrate or the second substrate, the thickness of the adhesive layer can be precisely adjusted substantially over the entire area thereof, and uniform display performance and a long product life can be realized.

In addition, in the method for manufacturing an electro-optical device, according to the present invention, in the disposing step, it is preferably that a gap be formed between the first substrate and the second substrate, and that at least one of drying means and deoxidizing means be provided in the gap. According to the method for manufacturing an electro-optical device, described above, an electro-optical device in which the gap is dried for a long period of time can be manufactured, and an organic EL device which can maintain stable luminous properties for a long period of time can be manufactured.

BRIEF DESCRIPTION OF THE DRAWINGS

FIG. 1 is a schematic cross-sectional view showing an electro-optical device of an embodiment according to the present invention.

FIG. 2 is a schematic cross-sectional view showing another embodiment of a measurement surface of an electro-optical device according to the present invention.

FIG. 3 is a plan view of a sealing substrate of an electro-optical device according to the present invention.

FIG. 4 is a plan view showing another embodiment of a sealing substrate according to the present invention.

FIG. 5 is a view for explaining a first step of a method for manufacturing an electro-optical device of an embodiment according to the present invention.

FIG. 6 is a view for explaining second to fifth steps of a manufacturing method according to the present invention.

FIG. 7 is a view for explaining a sixth step of a manufacturing method according to the present invention.

FIG. 8 is a view for explaining another embodiment of the sixth step according to the present invention.

FIG. 9 is a schematic cross-sectional view showing a particular example of an electro-optical device of this embodiment.

FIG. 10 is a circuit diagram showing an active matrix type display device.

FIG. 11 is a view showing an example of an electronic apparatus provided with an electro-optical device of this embodiment.

FIG. 12 is a view showing an example of an electronic apparatus provided with an electro-optical device of this embodiment.

FIG. 13 is a view showing an example of an electronic apparatus provided with an electro-optical device of this embodiment.

PREFERRED EMBODIMENTS

Hereinafter, an electro-optical device according to the present invention and a manufacturing method thereof will be described with reference to FIGS. 1 to 8. In this embodiment, an organic EL device will be described by way of example as an electro-optical device; however, the present invention is not limited thereto, and the application of the present invention to a liquid crystal device.

(Structure of Electro-optical Device)

FIG. 1 is a schematic cross-sectional view showing an electro-optical device of this embodiment.

This electro-optical device is an organic EL device and comprises a sealing substrate 1 (second substrate) composed of a transparent plate member and a substrate 5 (first substrate), one side of which is sealed by the sealing substrate 1. In this embodiment, on the substrate 5, an organic EL element layer 4 is formed including transparent electrodes, an organic EL layer, and counter electrodes (reflective cathodes). The organic EL element layer 4 is then sealed with the sealing substrate 1. In addition, the sealing substrate 1 and the substrate 5 are bonded to each other with an adhesive layer 3 which is formed by curing an adhesive.

Furthermore, on the sealing substrate 1, a plurality of measurement surfaces 6 each composed of a convex-shaped projection is formed. The measurement surface 6 is formed in parallel to the upper surface of the substrate 5 and is positioned at a height, which is defined based on the upper surface of the substrate 5, approximately equivalent to that of an adhesion surface 7 which is a contact surface between the sealing substrate 1 and the adhesive layer 3. The measurement surfaces 6 are used for measuring the thickness (in other word, the distance between the sealing substrate 1 and the substrate 5) of the adhesive layer 3.

As is a measurement surface 6' shown in FIG. 2, the measurement surface 6 may be formed so as to have a height different from that of the adhesion surface 7 by a desired value T, that is, a height different from that of the adhesion surface 7 by the desired value T based on the upper surface or the bottom surface of the sealing substrate 1. According to that described above, the thickness of the adhesive layer 3 is obtained in a manner in which the desired value T is deducted from (or added to) the distance (measured value) between the upper surface of the substrate 5 and the measurement surface 6.

In the above case, the desired value T is preferably 100 μm or less. The reason for this is that the thickness of the adhesive layer 3 is generally about 5 μm, and by measuring the distance between the measurement surface 6 or 6' and a surface a of the substrate 5, which faces the measurement surface 6 or 6', the thickness of the adhesive layer 3 is measured so as to adjust the thickness of the adhesive layer 3. That is, when the desired value T is set to a value very different from the thickness of the adhesive layer 3, it becomes difficult to precisely measure the thickness of the adhesive layer 3.

As particularly described later in the description of a manufacturing method, the thickness of the adhesive layer 3 is measured by an optical interference thickness meter which emits predetermined measurement light from the sealing substrate 1 side or the substrate 5 side.

In addition, the sealing substrate 1 and the substrate 5 are adhered to each other to form a gap therebetween (in particular, on the cathodes of the organic EL element layer 4 of the substrate 5). In addition, in this gap, the measurement surfaces 6 are provided. In this case, a drying agent (drying means) 3 is preferably disposed in the gap at a position separated from the organic EL element layer 4 of the substrate 5. In this embodiment, the drying agent 3 is fixed on a surface of the sealing substrate 1 at the gap side. As the drying agent 3, for example, a flat-shaped solid agent is used and is fixed to the sealing substrate 1 with an adhesive, a tacky agent, or a double-sided adhesive tape. Instead of the drying agent 3, a deoxidizing agent (deoxidizing means) may be provided in the gap. In addition, both the drying agent 3 and the deoxidizing agent may be provided.

As the adhesive forming the adhesive layer 3, a heat curable or a ultraviolet curable type may be used; however, since curing is performed upon obtaining a desired thickness of the adhesive layer by pressing the sealing substrate 1 and the substrate 5 to each other while the thickness being controlled, a ultraviolet curable type is preferable. As the organic El device element layer 4, a low molecular weight EL and a high molecular weight EL may both be used. As long as being transparent, a material such as a plastic, in addition to a glass, may be used for the substrate 5.

FIG. 3 is a plan view of the sealing substrate 1. As shown in this figure, the sealing substrate 1 has a rectangular shape, and the measurement surface 6 is disposed at each of the four corners of the sealing substrate 1. A sunken surface 8 is a surface formed by grinding the sealing substrate 1 except for the measurement surfaces 6 and the adhesion surface 7 provided in the vicinity of the periphery of one side surface of the sealing substrate 1.

FIG. 4 is a plan view of a sealing substrate 1' according to another embodiment. In the sealing substrate 1', in order to more precisely perform the control of the thickness of the adhesive layer 3, the measurement surfaces 6 are each provided at each of the four corners of the sealing substrate 1 and at each side thereof.

Portions of the surface a of the substrate 5, which faces the measurement surfaces 6', of the organic EL device shown in FIG. 1, each preferably have a reflectance of 90% or less. The reason for this is that when the reflectance of the surface a of the substrate 5 is more than 90%, the amount of light reflected from the surface a of the substrate 5 of light emitted from the optical interference thickness meter becomes excessively large as compared to that of light reflected from the measurement surfaces 6, and as a result, it becomes difficult to perform precise measurement by an optical interference thickness meter.

Accordingly, for example, as the substrate 5, a glass substrate is used, and at the portions of the surface a of the substrate 5, which face the measurement surfaces 6, ITO (Indium Tin Oxide) is formed on the glass substrate.

In addition, mirror finish is preferably performed for the measurement surfaces 6 so that the reflectance of the measurement surface 6 observed from the sealing substrate 1 is approximately 30%.

According to those described above, the distance between each of the measurement surfaces 6 of the sealing substrate 1 and the surface a of the substrate 5 on which the organic EL element layer 4 is formed can be measured by an optical interference thickness meter.

For comparison, when an aluminum (for example, a reflectance of 96%) film is formed on the glass substrate, at the portions of the surface a of the substrate 5, the optical interference becomes indistinct by the reflection, and as a result, the measurement cannot be satisfactorily performed.

As the electro-optical device, the organic EL device is described by way of example; however, the structure described above can also be applied to a liquid crystal device. In the case of the liquid crystal device, between the first substrate and the second substrate, liquid crystal is enclosed.

(Method for Manufacturing Electro-Optical Device)

Next, a method for manufacturing the organic EL device will be described.

This manufacturing method comprises a first step of applying an adhesive, a second step of aligning substrates, a third step of pressing the substrates, a fourth step of measuring the adhesive layer 3, a fifth step of controlling the amount of pressing of the substrate, and a sixth step of curing the adhesive.

FIG. 5 is a view for explaining the first step, FIG. 6 is a view for explaining the second to the fifth steps, and FIGS. 7 and 8 are views for explaining the sixth step.

In the first step, onto the peripheral portion (portion of the adhesion surface 7 shown in FIG. 3 or 4) of the substrate 5 on which the organic EL element layer 4 is formed or of the sealing substrate 1 except the measurement surfaces 6, the adhesive is applied. A particular example of the first step will be described with reference to FIG. 5.

First, as shown in FIG. 5, the substrate 5 provided with the organic EL element layer 4 is conveyed in an inert gas atmosphere (such as nitrogen), and in the inert gas atmosphere, a ultraviolet curable adhesive 22 is applied onto the substrate 5 by a dispenser 21. In the pattern formed by the application of the adhesive 22, when the substrate 5 and the sealing substrate 1 are bonded to each other, a gas outlet 23 must be formed for removing a gas present inside.

Instead of the substrate 5, the adhesive 22 may be applied to the adhesion surface 7 of the sealing substrate 1. In addition, as the adhesive 22, a heat curable adhesive may also be used.

In the second step, the sealing substrate 1 is aligned with the substrate 5. That is, in the second step, the sealing substrate 1 is disposed with respect to the substrate 5 so that the portion onto which the adhesive 22 is applied is sandwiched between the substrate 5 and the sealing substrate 1 to form the adhesive layer 3. In particular, as shown in FIG. 6, the substrate 5 is placed on a surface table 13, and the sealing substrate 1 provided with a drying agent 2 is aligned with a predetermined position on the substrate 5.

In the third step, by pressing the sealing substrate 1 or the substrate 5, the sealing substrate 1 is contact bonded to the substrate 5. For example, as shown in FIG. 6, the sealing substrate 1 is pressed to the substrate 5 side by a manipulator functioning as a contact bonding device 11. In this step, the contact bonding device 11 presses a plurality of positions, and the positions are preferably provided in the vicinity of the adhesive layer 3 at regular intervals. The reason for this is that the control is easily performed so as to enable the adhesive layer 3 to have a uniform desired predetermined thickness at every position thereof.

In the fourth step, during the application of the pressure in the third step, the thickness (film thickness) of the adhesive layer 3 is sequentially measured by an optical interference thickness meter 30. In this step, as described above, the optical interference thickness meter 30 measures the distance between the measurement surface 6 and the surface a (see FIG. 1) of the substrate 5 which faces the measurement surface 6. Accordingly, when a plurality of the measurement surfaces 6 is provided as shown in FIG. 3 or 4, the measurement is performed for each of the plurality of measurement surfaces 6 by the optical interference thickness meters 30.

As means for measuring the film thickness of the adhesive layer 3, instead of using the optical interference thickness meter 30, a microscopic optical system may be used. In particular, a position (first position) of a lens or the like of a microscopic optical system at which the lens is focused on the surface of the substrate 5 is compared to a position (second position) of the lens or the like of the microscopic optical system at which the lens is focused on the measurement surface 6 of the sealing substrate 1 so as to measure the difference between the first position and the second position, and based on the difference thus obtained, the film thickness of the adhesive layer 3 is measured. In this case, for focusing the microscopic optical system, on the measurement surfaces 6 and the surface of the substrate 5, a certain type of pattern is formed. In addition, instead of directly measuring the positions of the lens or the like of the microscopic optical system, the first position and the second position may be measured by measuring the amount of rotation of a rotation shaft for changing the focus of the microscopic optical system.

In addition, in the fourth and the fifth steps, the measured film thickness of the adhesive layer 3 is preferably sequentially displayed. Accordingly, since the film thickness of the adhesive layer 3 can be confirmed in the manufacturing process, the adjustment of a manufacturing apparatus can be easily performed at an early stage of the manufacturing, and in addition, the generation of defects can be decreased.

In the fifth step, based on the measurement of the thickness of the adhesive layer 3 detected in the fourth step, the pressing amount in the third step is controlled, so that the adhesive layer 3 has a film thickness. In particular, a controller 32 sequentially reads the measured values obtained by the optical interference thickness meter 30, and when the measured value (film thickness of the adhesive layer) is larger than the desired thickness (for example, 5 $\mu$m) at a certain place, the contact bonding is further performed by controlling a contact bonding device 31 located in the vicinity of the place mentioned above. That is, the controller 32 drives the contact bonding device 31 in the vicinity of a place at which the film thickness has not a desired value until the measured value obtained by every optical interference thickness meter 30 becomes the desired thickness.

It is not always necessary that the optical interference thickness meters 30 be disposed at the sealing substrate 1 side, and they may also be disposed at the substrate 5 side. In addition, it is not always necessary that the contact bonding devices 31 be disposed at the sealing substrate 1 side, and they may be disposed at the substrate 5 side.

In the sixth step, in the state in which the adhesive layer 3 has the desired thickness in the fifth step, the adhesive 22 and an adhesive agent are cured. In order to cure the adhesive 22, as shown in FIG. 7, the adhesive 22 is irradiated with ultraviolet rays emitted from a ultraviolet radiation device 34. The ultraviolet rays emitted from the ultraviolet radiation device 34 are transmitted to the adhesive 22 forming the adhesive layer 3 through optical fibers 35.

In addition, as the sixth step, as shown in FIG. 8, in the state in which the substrate 5 is placed on a transparent surface table 33', and in which the organic EL element layer (for example, a pixel region) is protected by a mask 17, the adhesive 22 forming the adhesive layer 3 may be irradiated with ultraviolet rays 37 from the bottom surface side (the transparent surface table 33' side) of the substrate 5 for curing.

When a heat curable adhesive is used as the adhesive 22 forming the adhesive layer 3, the sealing substrate 1 or the substrate 5 is being pressed by the contact bonding device 31 until the adhesive 22 is cured.

(Particular Examples of Electro-optical Device)

Hereinafter, an electro-optical device of a particular example of this embodiment will be described with reference to FIG. 9. FIG. 9 is a cross-sectional view showing an example of an organic EL device which is an electro-optical device of this embodiment.

In FIG. 9, an organic EL device 50 comprises a light-transmitting substrate (light-transmitting layer, corresponding to the substrate 5 in FIG. 1) 52; an organic EL element (light-emitting element, corresponding to the organic EL element layer in FIG. 1) 59, which is composed of a light-emitting layer 55 formed from an organic electroluminescent material and a hole-transporting layer 56 and which is provided between a pair of cathode (electrode) 57 and an anode (electrode) 58; and a sealing substrate 320 (corresponding to the sealing substrate 1 in FIG. 1).

In addition, as is the sealing substrate 1 in FIG. 1, the sealing substrate 320 is provided with the measurement surfaces 6. The sealing substrate 320 and the anode 58 on the substrate 52 are adhered to each other with the adhesive layer 3, and with the sealing substrate 320 and the adhesive layer 3, the organic EL element 59 is sealed. In this case, the organic EL device 50 shown in FIG. 9 has the structure in which light emitted from the light-emitting layer 55 is transmitted outside the device from the substrate 52 side.

Accordingly, in manufacturing the organic EL device 50, the optical interference thickness meters 30 (see FIG. 6) may be provided at the substrate 52 side in stead of the sealing substrate 320 side. That is, measurement light of the optical interference thickness meter 30 may be emitted to the measurement surface 6 from the substrate 52 side so as to measure the film thickness of the adhesive layer 3.

As a material for forming the substrate 52, for example, there may be mentioned a transparent or a semi-transparent material capable of transmitting light therethrough, such as a transparent glass, quartz, sapphire, or a transparent synthetic resin including polyester, polyacrylate, polycarbonate, or poly(ether ketone). In particular, as the material for forming the substrate 52, an inexpensive glass is suitably used.

In addition, when the emitted light is transmitted outside from the side (sealing substrate 320 side) opposite to the substrate 52, the substrate 52 may be opaque, and in this case, for example, a ceramic such as alumina, a metal sheet made of stainless steel, silicon, or the like processed by insulating treatment such as surface oxidation, a thermosetting resin, a thermoplastic resin may be used.

The anode 58 is a transparent electrode made of indium tin oxide (ITO) or the like and is capable of transmitting light therethrough. The hole transporting layer 56 is made, for example, of a triphenylamine derivative (TPD), a pyrazoline derivative, an arylamine derivative, a stilbene derivative, or a triphenyldiamine derivative. In particular, materials disclosed in Japanese Unexamined Patent Application Publication Nos. 63-70257, 63-175860, 2-135359, 2-135361, 2-209988, 3-37992, and 3-152184 may be mentioned by way of example; however, a triphenyldiamine derivative is preferable, and 4,4'bis(N(3-methylphenyl)-N-phenylamine) biphenyl is more preferable.

Instead of the hole transporting layer, a hole injection layer may be formed, and in addition, the hole injection layer and the hole transporting layer may both be formed. In this case, as a material for forming the hole injection layer, for example, there may be mentioned copper phthalocyanine (CuPc), poly(phenyl vinylene) obtained from polytetrahydrothiophenylphenylene, 1,1-bis(4-N,N-ditrylaminophenyl) cyclohexane, or tris(8-hydroxyquinolinol)aluminium; however, in particular, copper phthalocyanine (CuPc) may be used. As a polymeric material for forming the hole injection layer, for example, PEDOT (polyethylene dioxythiophen) PSS (poly(styrene sulfonic acid)), polythiophene, polypyrrole, polyaniline, and a derivative thereof may be preferably used.

As materials for forming the light-emitting layer 55, low molecular weight organic luminous dyes and polymeric luminous materials, that is, various luminous materials such as fluorescent materials and phosphorescent materials, and organic electroluminescent materials such as $Alq_3$ (aluminum chelating complex) may be used. As a luminous material among conjugated polymeric materials, a material having an arylene vinylene or a polyfluorene structure is particularly preferable. As low molecular weight luminous materials, for example, there may be mentioned dyes including a naphthalene derivative, an anthracene derivative, a perylene derivative, a polymethine-based, a xanthene-based, a coumarin-based, and a cyanine-based dye; metal complexes of 8-hydroquinoline and its derivative; aromatic amines, tetraphenylcyclopentadiene derivarives, or known materials disclosed, for example, in Japanese Unexamined Patent Application Publication Nos. 57-51781 and 59-194393. The cathode 7 is preferably a metal electrode composed of calcium (Ca), aluminum (Al), magnesium (Mg), gold (Au), silver (Ag), or the like.

In addition, between the cathode 57 and the light-emitting layer 55, an electron transporting layer or an electron injection layer may be provided. Materials for forming the electron transporting layer is not specifically limited, and for example, there may be mentioned oxadiazole derivatives, anthraquinonedimethane and its derivatives, benzoquinone and its derivatives, naphtoquinone and its derivatives, anthraquinone and its derivatives, tetracyanoanthraquinodimethane and its derivatives, fluorenon derivatives, diphenyldicyanoethylene and its derivatives, diphenoquinone derivatives, and metal complexes of 8-hydroxyqunoline and its derivatives. In particular, as is the material for forming the hole transporting layer described above, for example, materials disclosed in Japanese Unexamined Patent Application Publication Nos. 63-70257, 63-175860, 2-135359, 2-135361, 2-209988, 3-37992, and 3-152184 may be mentioned, and particularly, 2-(4-biphenyl)-5-(4-t-butylphenyl)-1,3,4-oxadiazole, benzoquinone, anthraquinone, and tris(8-quinolinol)aluminum are preferable.

Although not shown in the figure, the organic EL device 50 of this embodiment is an active matrix type, and actually a plurality of data lines and a plurality of scanning lines are provided on the substrate 52 so as to form a grating pattern. To each of pixels disposed in a matrix defined by the data lines and the scanning lines, previously, the above organic EL element 59 is connected through a drive TFT such as a switching transistor or a driving transistor. When a drive signal is fed through the data line or the scanning line, current flows between the electrodes, light is emitted from the light-emitting layer 55 of the organic EL element 59 and is then transmitted to the outer side of the substrate 52, so that the pixel is turned on.

In the organic EL device 50 of this embodiment, since the adhesive layer 3 can be formed to have a uniform and desired thickness, as described above, the product life is long, and stable light-emitting properties (display performance) can be maintained for a long period of time. In addition, by the manufacturing method of the embodiment described above, the manufacturing cost can be decreased as compared to that in the past.

FIG. 10 is a view showing an example of the case in which the electro-optical device of this embodiment is applied to an active matrix type display device (electro-optical device) using organic electroluminescent elements.

An organic EL device S1 in FIG. 10 corresponds to the organic El element layer 4 formed on the substrate 5 shown in FIG. 1, and as shown in FIG. 10, which is a circuit-diagram, on the substrate, a plurality of scanning lines 131, a plurality of signal lines 132 extending in the direction crossing these scanning lines 131, and a plurality of common electricity supply lines 133 extending in parallel with the signal lines 132 are formed. In addition, at each of the crossing points between the scanning lines 131 and the signal lines 132, a pixel (pixel region unit) AR is provided so as to form the structure.

For the signal lines 132, a data line drive circuit 390 comprising a shift register, a level shifter, a video line, and an analog switch is provided.

On the other hand, for the scanning lines 131, a scanning line drive circuit 380 comprising a shift register and a level shifter is provided. In addition, in each pixel region AR, there are provided a first transistor 322 in which a scanning signal is supplied to a gate electrode thereof through the scanning line 131; a holding capacitor cap holding an image signal supplied from the signal line 132 through this first transistor 322; a second transistor 324 in which the image signal held by the holding capacitor cap is supplied to a gate electrode thereof; a pixel electrode 323 to which a drive current flows from the common electricity supply line 133 when the pixel electrode 323 is electrically connected thereto through the second transistor 324; and a light-emitting portion (light-emitting layer) 360 provided between this pixel electrode (anode) 323 and a counter electrode (cathode) 222.

In the structure described above, when the scanning line 131 is driven to put the first transistor 322 in an On state, the potential of the signal line 132 at this time is held in the holding capacitor cap, and in accordance with the state of the holding capacitor cap, the electrical conduction state of the second transistor 324 is determined. Next, through the channel of the second transistor 324, current flows from the common electricity supply line 133 to the pixel electrode 323, and in addition, current flows to the counter electrode 222 through the light-emitting layer 360, so that the light emitting layer 360 starts to emit light in accordance with the amount of current flowing therethrough.

(Electronic Apparatus)

Examples of electronic apparatuses each provided with the electro-optical device of the above embodiment will be described.

FIG. 11 is a perspective view showing an example of a mobile phone. In FIG. 11, reference numeral 1000 indicates a mobile phone body, and reference numeral 1001 indicates a display portion using the above electro-optical device.

FIG. 12 is a perspective view showing an example of a wristwatch type electronic apparatus. In FIG. 12, reference numeral 1100 indicates a watch body, and reference numeral 1101 indicates a display portion using the above electro-optical device.

FIG. 13 is a perspective view showing an example of a mobile information processing apparatus such as a word processor or a personal computer. In FIG. 13, reference numeral 1200 indicates an information processing apparatus, reference numeral 1202 indicates an input portion such as a keyboard, reference numeral 1204 indicates an information processing apparatus body, and reference numeral 1206 indicates a display portion using the above electro-optical device.

Since the electronic apparatuses shown in FIGS. 11 to 13 are each provided with the electro-optical device according to the embodiment described above, the product life is long, and stable light-emitting properties (display properties) can be maintained for a long period of time. In addition, according to the manufacturing method described above, the manufacturing cost can be decreased as compared to that in the past.

The technical scope of the present invention is not limited to the embodiments described above, and various modifications may be performed without departing from the spirit and the scope of the present invention. It is apparently understood that the particular materials, layer structures, and the like in the above embodiments are simply described by way of example, and the modifications thereof may be optionally performed.

As can be seen from the above description, according to the present invention, the gap between the two substrates, which are the constituent elements of the electro-optical device, or the thickness of the adhesive layer which adheres the two substrates to each other can be precisely controlled.

The invention claimed is:

1. An electro-optical device, comprising:
    a first substrate;
    an adhesive layer;
    a second substrate adhered to the first substrate with the adhesive layer provided therebetween, the second substrate being composed of a plate member, a gap being defined between the first substrate and the second substrate; and
    a measurement surface that protrudes from the second substrate into the gap, the measurement surface being separated from the first substrate by a space and usable to measure the thickness of the adhesive layer.

2. The electro-optical device according to claim 1, the measurement surface being not applied with an adhesive.

3. The electro-optical device according to claim 1, the surface of the first substrate, facing the measurement surface, having a part having a reflectance of 90% or less.

4. The electro-optical device according to claim 1, a difference in height between measurement surface and an adhesion surface formed between the adhesion layer and the second substrate being 100 µm or less.

5. The electro-optical device according to claim 1, the measurement surface being processed by smoothing treatment.

6. The electro-optical device according to claim 1, the first substrate and the second substrate each having a square shape, and a measurement surface being provided at each of the individual four corners of the square shape.

7. The electro-optical device according to claim 1, further comprising:
    a plurality of scanning lines and a plurality of data lines, which are formed in a matrix;
    a switching device connected to the scanning lines and the data lines; and
    pixel electrodes connected to the switching device.

8. An electronic apparatus, comprising:
    the electro-optical device according to claim 1.

9. An electro-optical device comprising:
    a first substrate;
    an adhesive layer;
    a second substrate adhered to the first substrate with the adhesive layer provided therebetween, the second substrate being composed of a plate member, a gap being defined between the first substrate and the second substrate; and
    at least four measurement surfaces provided in the gap and usable to measure the thickness of the adhesive layer.

10. An electro-optical device, comprising:
    a first substrate;
    an adhesive layer;
    a second substrate adhered to the first substrate with the adhesive layer provided therebetween, the second substrate being composed of a plate member, a gap being defined between the first substrate and the second substrate;
    electrodes and a light-emitting layer disposed between the first substrate and the second substrate; and
    a measurement surface provided in the gap and usable to measure the thickness of the adhesive layer.

11. An electro-optical device comprising:
    a first substrate;
    an adhesive layer;
    a second substrate adhered to the first substrate with the adhesive layer provided therebetween, the second substrate being composed of a plate member, a gap being defined between the first substrate and the second substrate;
    at least a drying device and a deoxidizing device provided in the gap; and
    a measurement surface provided in the gap and usable to measure the thickness of the adhesive layer.

* * * * *